United States Patent [19]

David

[11] Patent Number: 4,651,181
[45] Date of Patent: Mar. 17, 1987

[54] FIELD EFFECT TRANSISTORS HAVING PARALLEL-CONNECTED SUBTRANSISTORS

[75] Inventor: Gérard R. David, Cambes en Plaine, France

[73] Assignee: U. S. Philips Corporation, New York, N.Y.

[21] Appl. No.: 827,484

[22] Filed: Feb. 6, 1986

Related U.S. Application Data

[63] Continuation of Ser. No. 520,381, Aug. 4, 1983, abandoned.

[30] Foreign Application Priority Data

Aug. 9, 1982 [FR] France ............... 82 13861

[51] Int. Cl.$^4$ .................. H01L 29/78; H01L 29/08; H01L 27/08
[52] U.S. Cl. .................. 357/23.4; 357/20; 357/86
[58] Field of Search ............ 357/23.4, 20, 86

[56] References Cited

FOREIGN PATENT DOCUMENTS 56-94774  7/1981  Japan .................. 357/23.4

OTHER PUBLICATIONS

"Siliconix Undercuts Power MOSFET Industry", Electronic Engineering, Feb. 1983, p. 15.

Primary Examiner—William D. Larkins
Assistant Examiner—John Lamont
Attorney, Agent, or Firm—Robert T. Mayer; Steven R. Biren

[57] ABSTRACT

A semiconductor device includes a semiconductor body in which a field effect transistor is formed which is composed of a number of parallel-connected subtransistors. Each subtransistor comprises a polygonal box-shaped cell of the semiconductor body. These cells each comprise a first semiconductor zone embedded in the semiconductor body and a second semiconductor zone embedded in the first zone. The peripheral part of the semiconductor body surrounding the first zone serves as a drain zone of the subtransistor, while the second zone serves as a source zone and a narrow edge strip of the first zone lying between the second zone and the peripheral part serves as a channel zone. The peripheral part comprises strip-shaped parts which extend in the direction of a central part of the first zone. The transistor has a comparatively low resistance in the switched-on state.

3 Claims, 5 Drawing Figures

FIELD EFFECT TRANSISTORS HAVING PARALLEL-CONNECTED SUBTRANSISTORS

This is a continuation of application Ser. No. 520,381, filed Aug. 4, 1983, now abandoned.

BACKGROUND OF THE INVENTION

The invention relates to a semiconductor device having a semiconductor body of a first conductivity type which is provided with a planar surface and in which a field effect transistor is formed which is composed of a number of parallel-connected subtransistors which each comprise a polygonal box-shaped cell of the semiconductor body, which cells each have a semiconductor zone of the second opposite conductivity type which is embedded in the semiconductor body and is provided with an edge directed at right angles to the surface and extending so that a peripheral part of the semiconductor body surrounding the first zone adjoins the surface. A second zone of the first conductivity type is embedded in this first zone, and the second zone adjoins the surface and is provided with a central opening and with an edge which extends at a substantially fixed distance from the edge of the first zone so that a central part and a narrow edge strip of the first zone adjoin the surface, the edge strip extending at least over part of its length at a substantially fixed distance from corresponding parts of edge strips of adjacent cells. The peripheral part of the semiconductor body surrounding the first zone serves as a drain zone of a subtransistor, while the second zone adjoining the surface serves as a source zone of the subtransistor. The narrow edge strip of the first zone located between the drain zone constituted by the peripheral part of the semiconductor body and the source zone constituted by the second zone serves as the channel zone of the subtransistor. The p-n junction constituted by the central part of the first zone and the part of the second zone surrounding this zone is short-circuited by a metallization provided on the surface.

Such a semiconductor device may be used, for example, in high-power circuit arrangements. The field effect transistor present in the semiconductor device can be controlled directly from micro-electronic integrated circuits.

British Patent Application No. 2,033,658 discloses a semiconductor device of the kind mentioned above, in which the parallel-connected subtransistors each comprise a hexagonal cell of the semiconductor body. The narrow edge strip of the first zone, which constitutes the channel zone of a subtransistor, extends at a fixed distance from the edge of the cell and consequently also has a hexagonal shape. Another prior art hexagonally configured field effect transistor device is shown in French Pat. No. 2,438,917.

With comparatively low voltages between the source and the drain zones, such a transistor behaves like a resistor. The value of this resistor depends upon the size of the cross-section of the part of the semiconductor body through which current flows when the transistor is switched on. This part is constituted by the peripheral part of the semiconductor body surrounding the first zone. Its cross-section has a surface area which is approximately equal to the product of the length $l$ of the narrow edge strip of the first zone and half the distance $d$ between the edge strips of adjacent cells extending at a substantially fixed relative distance. It is of importance that the aforementioned resistor is as small as possible. Therefore, the surface area of the peripheral region should form the largest possible part of the overall cell surface area $S$. Since the distance $d$ cannot be chosen freely—it depends inter alia upon tolerances which have to be taken into account during the manufacture of the semiconductor device—the ratio $l/S$ should be as large as possible. It has been found that for a hexagonal cell form, such as the known described semiconductor device, the ratio $L/S$ is at most $d^{-1}$. This is the case if $l=2\cdot d\sqrt{3}$ and $S=2\cdot d^2\cdot\sqrt{3}$. The ratio $l/S$ can be considered as a filling factor, which for square and triangular cells also proves to be at most $d^{-1}$.

In the known described transistor, a central part of the first zone adjoins the surface of the semiconductor body. This means that $l$ and $S$ for reasons of manufacturing technique have to be approximately $10\cdot d$ and $15\cdot d^2$, respectively, for $d=8$ $\mu$m. The filling factor could be 125 mm$^{-1}$, but for the reasons mentioned above the latter is about 30% lower.

SUMMARY OF THE INVENTION

The invention inter alia has for its object to provide a semiconductor device of the kind mentioned above, in which the filling factor $l/S$ is a closer approximation of the theoretical value thereof. For this purpose, according to the invention, the device of the kind mentioned above is characterized in that the edge strip has loops which enclose strip-shaped parts of the peripheral part extending in the direction of the central part of the first zone. Due to the configuration of the invention, if $d=8$ $\mu$m a filling factor of approximately 120 mm$^{-1}$ can be achieved.

A semiconductor device according to the invention is preferably characterized in that the strip-shaped parts extending in the direction of the central part of the first zone have a width which is substantially equally large as the distance between the edge strips of adjacent cells extending at a substantially fixed relative distance. Thus, large differences in current density are prevented from occurring in the part of the semiconductor body surrounding the first zone.

BRIEF DESCRIPTION OF THE DRAWING

The invention will now be described more fully by way of example with reference to the accompanying drawing, in which.

The Figures are schematic and are not drawn to scale. For the sake of clarity, in the plan views insulating layers and electrically conducting contact layers are omitted.

DESCRIPTION OF THE PREFERRED EMBODIMENTS

Figure 1:
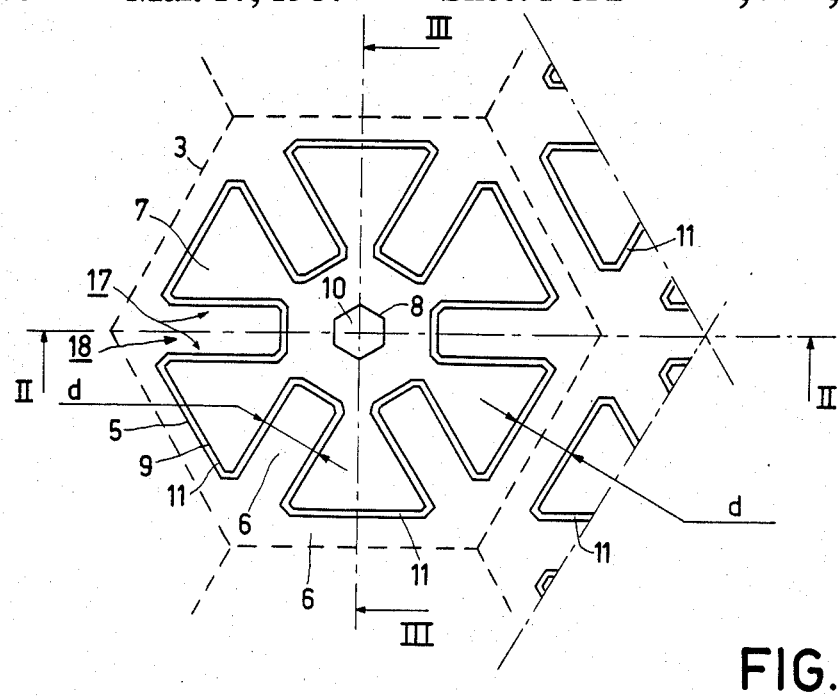
FIG. 1 shows diagrammatically in plan view a semiconductor device according to the invention.
Figure 2:
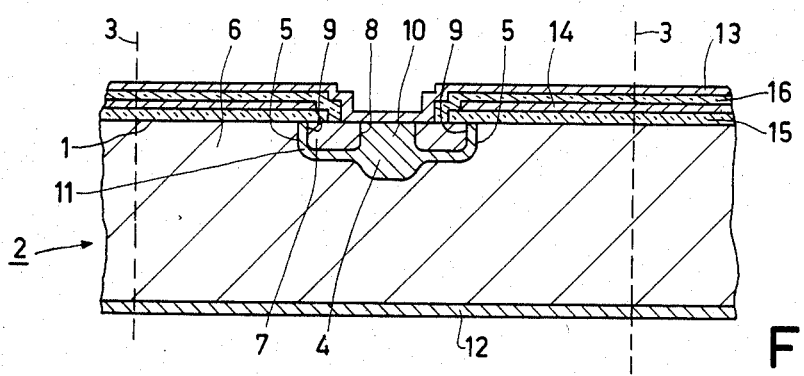
FIG. 2 is a cross-sectional view of the semi-conductor device taken on the line II—II in FIG. 1.
Figure 3:
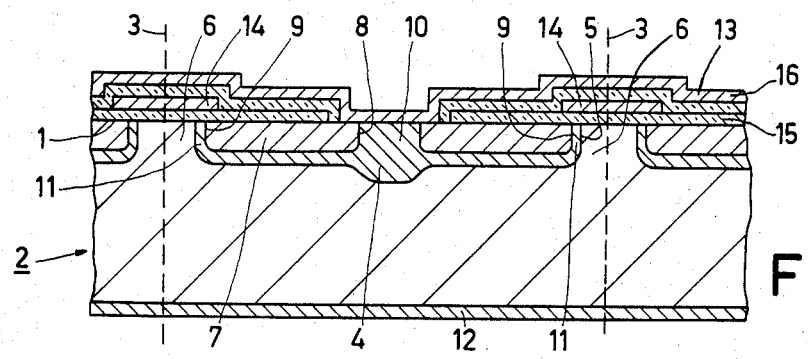
FIG. 3 is a cross-sectional view of the semi-conductor device taken on the line III—III in FIG. 1.

FIGS. 1, 2 and 3 show a semiconductor device having a semiconductor body 2 of a first conductivity type, in this example the n-type, which is provided with a planar surface 1 and in which a field effect transistor is formed, which is composed of a number of parallel-connected subtransistors which each comprise a box-shaped cell 3 of the semiconductor body 2. Each cell 3 comprises a first semiconductor zone 4 of the second opposite conductivity type, in this example the p-type, which is embedded in the semiconductor body 2, this zone 4 being provided with an edges directed at right angles to the surface 1 and extending so that a peripheral part 6 of the semiconductor body 2 surrounding the first zone 4 adjoins the surface 1. There is embedded in the first zone 4 a second zone 7 of the first conductivity type, in this example the n-type, which adjoins the surface 1 and is provided with a central opening 8 and with an edge 9 extending at a substantially fixed distance from the edge 5 of the first zone 4. Thus, a central part 10 and a narrow edge strip 11 of the first zone 4 adjoin the surface 1.

The peripheral part 6 serves as a drain zone of the subtransistor and is contacted by means of a metallization 12 provided on the back side of the semiconductor body 2. The second zone 7 adjoining the surface 1 serves as a source zone of the subtransistor and is contacted by means of a metallization 13. The narrow edge strip 11 serves as a channel zone of the subtransistor, above which there is provided in this example a gate electrode 14 made of polycrystalline silicon, which is separated from the surface 1 by an insulating silicon oxide layer 15 and from the metallization 13 by an insulating layer 16 of silicon oxide. The pn junction between the central part 10 of the first zone 4 and the second zone 7 is shortcircuited by the metallization 13.

With comparatively low voltages between the source and drain zones, the transistor behaves like a resistor, whose value depends upon the size of the cross-section of the peripheral part 6 of the semiconductor body 2. It is of importance that this resistor is as small as possible and that therefore the said cross-section is as large as possible.

The edge strip 11 extends at least over part of its length at a substantially fixed distance d from corresponding parts of edge strips of adjacent cells. According to the invention, the edge strip 11 has loops 17 which enclose strip-shaped parts 18 of the peripheral part 6, these parts 18 extending in the direction of the central part 10 of the first zone 4.

The strip-shaped parts 18 preferably have a width d which is substantially equally large as the distancre between the edge strips 11 of adjacent cells extending at a substantially fixed relative distance d. Thus, great differences in current density are prevented from occurring in the part of the semiconductor body 2 surrounding the first zone 4.

In order to ensure that the resistance of the transistor in the switched-on state is as small as possible, the surface area of the peripheral part 6 should form the largest possible part of the overall surface area S of the cell. Since the distance d cannot be chosen freely—it depends inter alia upon tolerances which have to be taken into account during the manufacture of the semiconductor device—it should be ensured that the ratio between the length l of the edge strip 11 and the surface area S is as large as possible. It has been found that the ratio $1/S$ is at most equal to $d^{-1}$, where $l = 18 \cdot d \cdot \sqrt{3}$ and $S = 18 \cdot d^2 \sqrt{3}$. Since for reasons of manufacturing technique there should also be a given distance between the central part 10 of the first zone 4 and the edge strip 11, the maximum ratio $1/S$ is not attained in practice, but it is approached very closely. If $d = 8$ $\mu$m, $1/S$ could be 125 mm$^{-1}$; in practice, this ratio becomes 120 mm$^{-1}$ because then both l and S have to be slightly larger than the aforementioned optimum values.

It should be noted that the distance between the central part 10 of the zone 4 and the edge strip 11 is not equal al all points, but varies between approximately 7 and 25 $\mu$m. However, these differences do not adversely affect operation with a voltage in the reverse direction, especially the second breakdown, under normal operating conditions, that is to say with operating voltages of less than 200 V.

Figure 4:
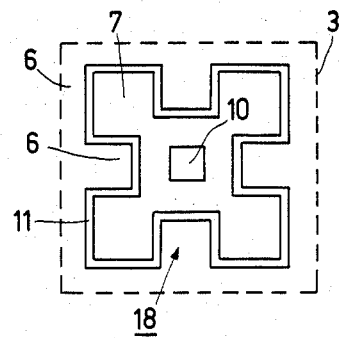
FIG. 4 shows diagrammatically in plan view a modification of the semiconductor device shown in FIG. 1.
Figure 5:
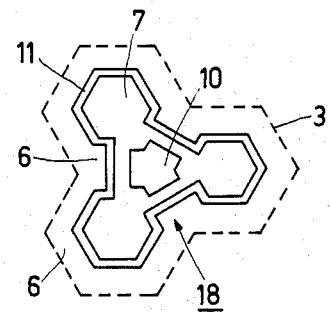
FIG. 5 shows diagrammatically a plan view of another modification of the semiconductor device shown in FIG. 1.

FIGS. 4 and 5 show diagrammatically in plan view modifications of the semiconductor device according to the invention. The same reference numerals as in FIG. 1 are used for corresponding parts. In FIG. 4, the cell 3 has a square form, while in FIG. 5 it has a form composed of three hexagonal basic patterns.

In all the embodiments, basic patterns can be recognized. In the embodiment shown in FIG. 1, the cell comprises six similar triangular basic patterns, while in the embodiment of FIG. 4 it comprises four tetragonal basic patterns and in the embodiment of FIG. 5 it comprises three hexagonal basic patterns. It is characteristic of all basic patterns that a part of the central portion 10 of the zone 4 is located at a corner thereof.

What is claimed is:

1. A semiconductor device comprising a semiconductor body of a first conductivity type and having a planar surface, a field effect transistor formed in said body and having a plurality of parallel-connected subtransistors, each of which forms a polygonal box-shaped cell within the semiconductor body, each cell having a first semiconductor zone of the second, opposite conductivity type in the semiconductor body and provided with an edge perpendiclar to the surface and extending so that a peripheral part of the semiconductor body surrounding the first zone adjoins the surface, said peripheral part having strip-shaped parts which extend toward the center of said first zone, a second zone of the first conductivity type in said first zone, adjoining the surface and having a central opening and an edge which extends perpendicular to the surface at a substantially fixed distance from the edge of the first zone so that a central part and a narrow edge strip of the first zone adjoin the surface, said edge strip extending over at least a part of its length at a substantially fixed distance from corresponding parts of edge strips of adjacent cells, and said edge strip having loops enclosing said strip-shaped parts of the peripheral part of the semiconductor body which extend in the direction of the central part of the first zone, the width of said strip-shaped parts being substantially equal to the distance between the portions of the edge strips of adjacent cells which extend at a substantially fixed distance from each other, and each cell comprising three substantially identical hexagonal patterns interconnected in a substantially triangular pattern.

2. A semiconductor device comprising a semiconductor body of a first conductivity type and having a planar surface, a field effect transistor formed in said body and having a plurality of parallel-connected subtransistors, each of which forms a polygonal box-shaped cell within the semiconductor body, each cell having a first semiconductor zone of the second, opposite conductivity type in the semiconductor body and provided with an edge perpendicular to the surface and extending so that a peripheral part of the semiconductor body surrounding the first zone adjoins the surface, said peripheral part having strip-shaped parts which extend toward the center of said first zone, a second zone of the first conductivity type in said first zone, adjoining the surface and having a central opening and an edge which extends perpendicular to the surface at a substantially fixed distance from the edge of the first zone so that a central part and a narrow edge strip of the first zone adjoin the surface, said edge strip extending over at least a part of its length at a substantially fixed distance from corresponding parts of edge strips of adjacent cells, and said edge strip having loops enclosing said strip-shaped parts of the peripheral part of the semiconductor body which extend in the direction of the central part of the first zone, the width of said strip-shaped parts being substantially equal to the distance between the portions of the edge strips of adjacent cells which extend at a substantially fixed distance from each other, and each cell comprising four substantially identical tetragonal patterns interconnected in a substantially tetragonal pattern.

3. A semiconductor device comprising a semiconductor body of a first conductivity type and having a planar surface, a field effect transistor formed in said body and having a plurality of parallel-connected subtransistors, each of which forms a polygonal box-shaped cell within the semiconductor body, each cell having a first semiconductor zone of the second, opposite conductivity type in the semiconductor body and provided with an edge perpendicular to the surface and extending so that a peripheral part of the semiconductor body surrounding the first zone adjoins the surface, said peripheral part having strip-shaped parts which extend toward the center of said first zone, a second zone of the first conductivity type in said first zone, adjoining the surface and having a central opening and an edge which extends perpendicular to the surface at a substantially fixed distance from the edge of the first zone so that a central part and a narrow edge strip of the first zone adjoin the surface, said edge strip extending over at least a part of its length at a substantially fixed distance from corresponding parts of edge strips of adjacent cells, and said edge strip having loops enclosing said strip-shaped parts of the peripheral part of the semiconductor body which extend in the direction of the central part of the first zone, the width of said strip-shaped parts being substantially equal to the distance between the portions of the edge strips of adjacent cells which extend at a substantially fixed distance from each other, and each cell comprising six substantially identical triangular patterns interconnected in a substantially hexagonal pattern.

* * * * *